(12) United States Patent
Watts et al.

(10) Patent No.: US 7,140,861 B2
(45) Date of Patent: Nov. 28, 2006

(54) COMPLIANT HARD TEMPLATE FOR UV IMPRINTING

(75) Inventors: Michael P. C. Watts, Austin, TX (US); Ronald D. Voisin, Austin, TX (US); Sidlgata V. Sreenivasan, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 27 days.

(21) Appl. No.: 10/833,240

(22) Filed: Apr. 27, 2004

(65) Prior Publication Data

US 2005/0236360 A1 Oct. 27, 2005

(51) Int. Cl.
B29C 59/02 (2006.01)

(52) U.S. Cl. .................. 425/174.4; 425/352; 425/363; 425/408

(58) Field of Classification Search ............. 425/174.4, 425/352–355, 408, DIG. 44, DIG. 124, 363
See application file for complete search history.

(56) References Cited

U.S. PATENT DOCUMENTS

| 3,677,178 A * | 7/1972 | Gipe .................. 101/450.1 |
|---|---|---|
| 4,201,800 A | 5/1980 | Alcom et al. |
| 4,512,848 A | 4/1985 | Deckman et al. |
| 4,722,878 A | 2/1988 | Watakabe et al. |
| 4,731,155 A | 3/1988 | Napoli et al. |
| 4,959,252 A | 9/1990 | Bonnebat et al. |
| 5,028,366 A | 7/1991 | Harakal et al. |
| 5,206,983 A | 5/1993 | Guckel et al. |
| 5,259,926 A | 11/1993 | Kuwabara et al. |
| 5,348,616 A | 9/1994 | Hartman et al. |
| 5,425,848 A | 6/1995 | Haisma et al. |
| 5,477,058 A | 12/1995 | Sato |
| 5,512,131 A | 4/1996 | Kumar et al. |
| 5,545,367 A | 8/1996 | Bae et al. |
| 5,601,641 A | 2/1997 | Stephens |
| 5,669,303 A | 9/1997 | Maracas et al. |
| 5,772,905 A | 6/1998 | Chou |
| 5,776,748 A | 7/1998 | Singhvi et al. |
| 5,817,376 A | 10/1998 | Everaerts et al. |
| 5,820,769 A | 10/1998 | Chou |
| 5,849,209 A | 12/1998 | Kindt-Larsen et al. |
| 5,849,222 A | 12/1998 | Jen et al. |

(Continued)

FOREIGN PATENT DOCUMENTS

EP 1460738 A2 9/2004

(Continued)

OTHER PUBLICATIONS

U.S. Appl. No. 10/687,519, filed Oct. 16, 2003, Nguyen et al.

(Continued)

*Primary Examiner*—Yogendra N. Gupta
*Assistant Examiner*—Thu Khanh T. Nguyen
(74) *Attorney, Agent, or Firm*—Kenneth C. Brooks; Michael D. Carter; Fish & Richardson P.C.

(57) ABSTRACT

A compliant UV imprint lithography template, which may also act as a thermal implant template, and methods for manufacturing it. The template essentially comprises a relief image and an elastomer adapted to adjust the relief image. In an embodiment, the relief image is arranged in a compliant imprinting layer where the elastomer is arranged between the imprinting layer and a rigid transparent substrate. In an embodiment, the template is compliant to a wafer surface. In an embodiment, layering an elastomer and an imprinting layer on a substrate and patterning a relief image into the imprinting layer, form the template.

32 Claims, 4 Drawing Sheets

U.S. PATENT DOCUMENTS

| | | |
|---|---|---|
| 5,853,446 A | 12/1998 | Carre et al. |
| 5,937,758 A | 8/1999 | Maracas et al. |
| 5,948,470 A | 9/1999 | Harrison et al. |
| 5,952,127 A | 9/1999 | Yamanaka |
| 5,956,216 A | 9/1999 | Chou |
| 6,051,345 A | 4/2000 | Huang |
| 6,117,708 A | 9/2000 | Wensel |
| 6,165,911 A | 12/2000 | Calveley |
| 6,190,929 B1 | 2/2001 | Wang et al. |
| 6,218,316 B1 | 4/2001 | Marsh |
| 6,251,207 B1 | 6/2001 | Schultz et al. |
| 6,261,469 B1 | 7/2001 | Zakhidov et al. |
| 6,309,580 B1 | 10/2001 | Chou |
| 6,316,290 B1 | 11/2001 | Wensel |
| 6,334,960 B1 | 1/2002 | Willson et al. |
| 6,355,198 B1 | 3/2002 | Kim et al. |
| 6,387,787 B1 | 5/2002 | Mancini et al. |
| 6,391,217 B1 | 5/2002 | Schaffer et al. |
| 6,399,406 B1 | 6/2002 | Chan et al. |
| 6,482,742 B1 | 11/2002 | Chou |
| 6,517,977 B1 | 2/2003 | Resnick et al. |
| 6,517,995 B1 | 2/2003 | Jacobenson et al. |
| 6,518,189 B1 | 2/2003 | Chou |
| 6,580,172 B1 | 6/2003 | Mancini et al. |
| 6,605,849 B1 | 8/2003 | Lutwak et al. |
| 6,607,173 B1 | 8/2003 | Westmoreland |
| 6,646,662 B1 | 11/2003 | Nebashi et al. |
| 6,664,026 B1 | 12/2003 | Nguyen et al. |
| 6,696,220 B1 | 2/2004 | Bailey et al. |
| 6,713,238 B1 | 3/2004 | Chou et al. |
| 6,716,754 B1 | 4/2004 | Hofmann et al. |
| 6,743,368 B1 * | 6/2004 | Lee .............................. 216/2 |
| 6,753,131 B1 | 6/2004 | Rogers et al. |
| 6,776,094 B1 | 8/2004 | Whitesides et al. |
| 6,809,356 B1 | 10/2004 | Chou |
| 6,828,244 B1 | 12/2004 | Chou |
| 6,849,558 B1 | 2/2005 | Schaper |
| 6,852,358 B1 | 2/2005 | Chen et al. |
| 6,890,688 B1 | 5/2005 | Mancini et al. |
| 6,900,881 B1 | 5/2005 | Sreenivasan et al. |
| 6,908,861 B1 | 6/2005 | Sreenivasan et al. |
| 6,916,584 B1 | 7/2005 | Sreenivasan et al. |
| 6,932,934 B1 | 8/2005 | Choi et al. |
| 7,037,639 B1 | 5/2006 | Voisin |
| 2002/0042027 A1 | 4/2002 | Chou et al. |
| 2002/0132482 A1 | 9/2002 | Chou |
| 2002/0135099 A1 | 9/2002 | Robinson et al. |
| 2002/0167117 A1 | 11/2002 | Chou |
| 2002/0175298 A1 | 11/2002 | Moniwa et al. |
| 2002/0177319 A1 | 11/2002 | Chou |
| 2003/0034329 A1 | 2/2003 | Chou |
| 2003/0062334 A1 | 4/2003 | Lee et al. |
| 2003/0080471 A1 | 5/2003 | Chou |
| 2003/0080472 A1 | 5/2003 | Chou |
| 2003/0113638 A1 | 6/2003 | Mancini et al. |
| 2003/0180631 A1 | 9/2003 | Shiota et al. |
| 2003/0205657 A1 | 11/2003 | Voisin |
| 2004/0007799 A1 | 1/2004 | Choi et al. |
| 2004/0008334 A1 | 1/2004 | Sreenivasan et al. |
| 2004/0009673 A1 | 1/2004 | Sreenivasan et al. |
| 2004/0021254 A1 | 2/2004 | Sreenivasan et al. |
| 2004/0021866 A1 | 2/2004 | Watts et al. |
| 2004/0022888 A1 | 2/2004 | Sreenivasan et al. |
| 2004/0036201 A1 | 2/2004 | Chou et al. |
| 2004/0046288 A1 | 3/2004 | Chou |
| 2004/0110856 A1 | 6/2004 | Young et al. |
| 2004/0118809 A1 | 6/2004 | Chou et al. |
| 2004/0124566 A1 | 7/2004 | Sreenivasan et al. |
| 2004/0131718 A1 | 7/2004 | Chou et al. |
| 2004/0137734 A1 | 7/2004 | Chou et al. |
| 2004/0150129 A1 | 8/2004 | Hougham et al. |
| 2004/0156108 A1 | 8/2004 | Chou et al. |
| 2004/0163563 A1 | 8/2004 | Sreenivasan et al. |
| 2004/0168586 A1 | 9/2004 | Bailey et al. |
| 2004/0192041 A1 | 9/2004 | Jeong et al. |
| 2004/0197843 A1 | 10/2004 | Chou et al. |
| 2004/0202865 A1 | 10/2004 | Homola et al. |
| 2004/0219246 A1 | 11/2004 | Jeans |
| 2004/0250945 A1 | 12/2004 | Zheng et al. |
| 2005/0037143 A1 | 2/2005 | Chou et al. |
| 2005/0051698 A1 | 3/2005 | Sreenivasan et al. |
| 2005/0064344 A1 | 3/2005 | Bailey et al. |
| 2005/0067379 A1 | 3/2005 | Sreenivasan et al. |
| 2005/0084804 A1 | 4/2005 | Truskett et al. |
| 2005/0098534 A1 | 5/2005 | Sreenivasan et al. |
| 2005/0100830 A1 | 5/2005 | Xu et al. |
| 2005/0158637 A1 | 7/2005 | Kim et al. |
| 2005/0230882 A1 | 10/2005 | Watts et al. |
| 2006/0019183 A1 | 1/2006 | Voisin |
| 2006/0096949 A1 | 5/2006 | Watts et al. |

FOREIGN PATENT DOCUMENTS

| | | |
|---|---|---|
| JP | 61-40845 | 2/1986 |
| JP | 1-196749 | 8/1989 |
| JP | 02-24848 | 1/1990 |
| JP | 02-92603 | 4/1990 |
| JP | 02192045 | 7/1990 |
| JP | 2-248480 | 10/1990 |
| JP | 3-90345 | 4/1991 |
| JP | 9-278490 | 10/1997 |
| WO | WO 87/02935 | 5/1987 |
| WO | WO 99/05724 | 2/1999 |
| WO | WO 00/21689 | 4/2000 |
| WO | WO 01/47003 | 6/2001 |
| WO | WO 01/90816 | 11/2001 |
| WO | WO 02/07199 | 1/2002 |
| WO | WO 02/22916 | 3/2002 |
| WO | WO 03/010289 | 2/2003 |
| WO | WO 03/079416 | 9/2003 |
| WO | WO 03/099536 | 12/2003 |
| WO | WO 2004/114016 | 12/2004 |

OTHER PUBLICATIONS

U.S. Appl. No. 10/666,527, filed Sep. 18, 2003, Bailey et al.
U.S. Appl. No. 10/714,088, filed Nov. 14, 2003, Sreenivasan et al.
U.S. Appl. No. 10/670,980, filed Sep. 25, 2003, Sreenivasan et al.
U.S. Appl. No. 10/827,118, filed Apr. 19, 2004, Watts et al.
U.S. Appl. No. 10/706,537, filed Nov. 12, 2003, Sreenivasan et al.
U.S. Appl. No. 10/895,214, field Jul. 20, 2004, Voison.
U.S. Appl. No. 10/917,761, filed Aug. 13, 2004, McMackin et al.
U.S. Appl. No. 11/051,941, filed Feb. 4, 2005, McMackin et al.
Chou, Nanoimprint Lithography and Lithographically Induced Self-Assembly, MRS Bulletin pp. 512-517, Jul. 1, 2001.
Choi et al., Design of Orientation Stages for Step and Flash Imprint Lithography, Precision Engineering, pp. 192-199, Jan. 1, 2001.
Colburn et al., Step and Flash Imprint Lithography for sub-100 nm Patterning, Proceedings of SPIE vol. 3997, pp. 453-457, Jan. 1, 2000.
Chou et al., Imprint Lithography with 25-Nanometer Resolution, Science vol. 272, pp. 85-87, Apr. 4, 1996.
Chou et al., Imprint Lithography with Sub-10 nm Feature Size and High Throughput, Microelectronic Engineering 35, pp. 237-240, Jan. 1, 1997.
Haisma et al., Mold-assisted Nanolithography: A Process for Reliable Pattern Replication, J. Vac. Sci. Technol. B, pp. 4124-4128, Nov. 1, 1996.
Chou et al., Imprint of Sub-25 nm Vias and Trenches in Polymers, Appl. Phys. Lett. 67 (21), Nov. 20, 1995.
Johnson et al., Advances in Step and Flash Imprint Lithography, SPIE Microlithography Conference, Feb. 23, 2003.
Chou et al., Lithographically Induced Self-assembly of Periodic Polymer Micropillar Arrays, J. Vac. Sci. Technol. B 17 (6), pp. 3197-3202, Nov. 1, 1999.

Colburn et al., Step and Flash Imprint Lithography: A New Approach to High-Resolution Patterning, Proc. of SPIE, vol. 3676, Mar. 1, 1999.

Heidari, Nanoimprint Lithography at the 6 in. Wafer Scale, J. Vac. Sci. Technol. B 18(6), pp. 3557-3560, Nov. 1, 2000.

Translation of Japanese Patent 02-92603.

Translation of Japanese Patent 02-24848.

Chou et al., Ultrafast and Direct Imprint of Nanostructures in Silicon, Nature, Col. 417, (Jun. 2002), pp. 835-837, Jun. 1, 2002.

Chou et al., Nanoimprint Lithography, Journal of Vacuum Science Technology B 14 (16), pp. 4129-4133, Nov. 1, 1996.

Colburn et al., Development and Advantages of Step-and-Flash Lithography, Solid State Technology, Jul. 1, 2001.

Resnick et al., High Resolution Templates for Step and Flash Imprint Lithography, Journal of Microlithography, Microfabrication, and Microsystems. vol. 1. No. 3., Oct. 1, 2002.

Colburn et al., Characterization and Modeling of Volumetric and Mechanical Properties for Step and Flash Imprint Lithography Photopolymers, Journal of Vacuum Science Technology, vol. b. 19(6), Nov. 1, 2001.

Bailey et al., Step and Flash Imprint Lithography: Defect Analysis, Journal of Vacuum Science, B 19(6), pp. 2806-2810, Nov. 1, 2001.

Bailey et al., Step and Flash Imprint Lithography: Template Surface Treatment and Defect Analysis, Journal of Vacuum Science, B 18(6), pp. 3572-3577, Nov. 1, 2000.

Schneider et al., Stripes of Partially Fluorinated Alkyl Chains: Dipolar Langmuir Monolayers.

Shibuichi et al., Super Water- and Oil-Repellent Surfaces Resulting from Fractal Structure, Journal of Colloid and Interface Science, vol. 208, No. 1, pp. 287-294 Dec. 1, 1998.

Taniguchi et al., Diamond Nanoimprint Lithography, Nanotechnology, 2002, vol. 13, No. 5, pp. 592-598(5) Jan. 1, 2002.

Kiyohara et al., Abstract of Plasma Etching of CVD Diamond Films using an ECR-type Oxygen Source, http://www.lop.org/EJ/abstract/0957-4484/10/4/304 Sep. 26, 2003.

Application No. 11/126,946, naming Inventors Choi et al., entitled Formation of Discontinuous Films During an Imprint Lithography Process, filed May 11, 2005.

Application No. 11/127,041, naming Inventors Sreenivasan et al., entitled Step and Repeat Imprint Lithography Processes, filed May 11, 2005.

Application No. 11/127,060, naming Inventors Sreenivasan et al., entitled Step and Repeat Imprint Lithography Systems, filed May 11, 2005.

Application No. 11/138,897, naming inventors Miller et al., entitled Imprint Lithography Template Having a Coating to Reflect and/or Absorb Actinic Energy, filed May 25, 2005.

Thompson et al., Fabrication of Step and Flash Imprint Lithography Templates Using Commercial Mask Processes, SPIE Microlithography Conference Feb. 1, 2003.

Yoneda et al., Translation of Japanese Patent 02-248480, Transparent Substrate with Water-Repellent and Antistaining Properties, and Structure Equipped Therewith Oct. 4, 1990.

Yoneda et al., Translation of Japanese Patent 02-248480, Transparent Substrate Material with Water-Repllent and Anti-Staining Properties and Structure Equipped with Same Oct. 4, 1990.

Kirby et al., In-Situ Fabrication of Dialysis Membranes in Glass Microchannels using Laser-induced Phase-Separation Polymerization, MicroTAS 2002, p. 742-744 Jan. 1, 2002.

Translation of Japanese Patent 61-40845, Feb. 1, 1986.

Translation of Japanese Patent 02-248480, Oct. 1, 1990.

Translation of Japanese Patent 03-090345, Apr. 1, 1991.

Translation of Japanese Patent 09-278490, Oct. 1, 1997.

Abstract of Japanese Patent 03-090345, Apr. 1, 1991.

Abstract of Japanese Patent 09-278490, Oct. 1, 1997.

Bien et al., Characterization of Masking Materials for Deep Glass Micromachining, J. Micromech. Microeng. 13 pp. S34-S40 Jan. 1, 2003.

Britten et al., Multiscale, Multifuncation Diffractive Structures We Etched into Fused Silica for High-Laser Damage Threshold Applications, Applied Optics, vol. 37, No. 30 Oct. 20, 1998.

Fletcher et al., Microfabricated Silicon Solid Immersion Lens, Jounral of Microelectromechnical Systems, vol. 10, No. 3 Sep. 1, 2001.

Khandaker et al., Fabrication of Microlens Arrays by Direct Electron Beam Exposure of Photoresist, Pure Appl. Opt. 6, pp. 637-641 Jan. 1, 1997.

Kim et al., Replication Qualities and Optical Properties of UV-moulded Microlens Arrays, J. Phys. D: Appl. Phys. 36; pp. 2451-2456 Jan. 1, 2003.

Kobayashi et al., Batch Bulk-Micromachined High-Precision Metal-On-Insulator Microspires and Their Application to Scanning Tunneling Microscopy, J. Micromech. Microeng. 14; pp. S76-S81 Jan. 1, 2004.

Konijn et al., Nanoimprint Lithography of Sub-100nm 3D Strucutres, Microelectronic Engineering 78-79; pp. 653-658 Jan. 1, 2005.

Kunnavakkam et al., Low-cost, Low-loss Microlens Arrays Fabricated by Soft-Lithography Replication Process, Applied Physics Letters, vol. 82, No. 8 Feb. 24, 2003.

Mansell et al., Binary-Optic Smoothing with Isotropic Etching, Applied Optics; vol. 36, No. 20 Jul. 10, 1997.

Waheed et al., Balancing Aerial Image Intensity for Alternating Aperture Phase Shift Masks Using an Isotropic Dry-Etch, Proceedings of SPIE vol. 5130 Apr. 18, 2003.

Sano et al., Submicron Spaced Lens Array Process Technology for a High Photosensitivity CCD Image Sensor, IEEE IEDM Dig.; pp. 283-286 Jan. 1, 1990.

Tsukamoto et al., High Sensitivity Pixel Technology for a 1/4 inch PAL 430k pixel IT-CCD, IEE Custom Integrated Circuits Conference Jan. 1, 1996.

Feynman, There's Plenty of Room at the Bottom, Dec. 1, 1959.

Xia et al., Soft Lithography, Angew. Chem. Int. Ed., pp. 550-575 Jan. 1, 1998.

Krug et al., Fine Patterning of Thin Sol-gel Films, Journal of Non-Crystalline Solids 147 & 148, pp. 447-450 Jan. 1, 1992.

Nguyen, Asymmetric Fluid-Structure Dynamics in Nanoscale Imprint Lithography, The University of Texas at Austin, pp. 1-111 Aug. 1, 2001.

Abstract of Japanese Patent 02-92603, Aug. 12, 2004.

Abstract of Japanese Patent 02-24848, Jan. 26, 1990.

Sowah, Diamond used to Break the Mould, Retrieved Sep. 2, 2003 from URL: http://www.electronictimes.com/story/OEG20020918S0003 Sep. 18, 2002.

Abstract of Japanese Patent 61-040845, Feb. 27, 1986.

Abstract of Japanese Patent 02-248480, Oct. 4, 1990.

Abstract of Japanese Patent 3-090345, Apr. 16, 1991.

Abstract of Japanese Patent 09-278490, Oct. 28, 1997.

Abstract of Japanese Patent 61-040845, Feb. 27, 1986.

Abstract of Japanese Patent 02-248480, Oct. 4, 1990.

Gehoski et al., Indium Tin Oxide Template Development for Step and Flash Imprint Lithgraphy, SPIE Microlithography Conference Feb. 1, 2005.

Dauksher et al., Repair of Step and Flash Imprint Lithography Templates, J. Vac. Sci. Technol. B 22 (6), pp. 3306-3311 Nov. 1, 2004.

Nordquist et al., Image Placement Issues for ITO-based Step and Flash Imprint Lithography Templates, J. Vac. Sci. Technol. B, pp. 695-701 Mar. 1, 2004.

Dauksher et al., Step and Flash Imprint Lithography Template Characterization, from an Etch Perspective, J. Vac. Sci. Technol. B 21(6), pp. 2771-2776 Nov. 1, 2003.

Resnick et al., Imprint Lithography: Lab Curiosity or the Real NGL?, SPIE Microlithography Conference Feb. 1, 2003.

Mancini et al., Analysis of Critical Dimension Uniformity for Step and Flash Imprint Lithography, SPIE Microlithography Conferene Feb. 1, 2003.

Mancini et al., Hydrogen Silsesquioxane for Direct Electron-Beam Patterning of Step and Flash Imprint Lithography Templates, J. Vac. Sci. Technol. B 20(6), pp. 2896-2901 Nov. 1, 2002.

Dauksher et al., Characterization of and Imprint Results Using Indium Tin Oxide-Based Step and Flash Imprint Lithography Templates, J. Vac. Sci. Technol. B 20(6), pp. 2857-2861 Nov. 1, 2002.

Nordquist et al.Q, Critical Dimension and Image Placement Issues for Step and Flash Imprint Lithography Templates, 22nd Annual BACUS Symposium on Photomask Technology, Monterey, CA Sep. 1, 2002.

Bailey et al., Template Fabrication Schemes for Step and Flash Imprint Lithography, Microelectronic Engineering, 61-62, pp. 461-467 Jan. 1, 2002.

Resnick et al., High Resolution Templates for Step and Flash Imprint Lithography, SPIE Microlithography Conference Feb. 1, 2002.

Resnick et al., New Methods for Fabricating Step and Flash Imprint Lithography Templates, NIST-SPIE Conference on Nanotechnology Sep. 2, 2001.

* cited by examiner

COMPLIANT HARD TEMPLATE FOR UV IMPRINTING

BACKGROUND OF THE INVENTION

1. Field of the Invention

The present invention relates to imprint lithography templates suitable for use in micro-fabrication of structures. The compliant template herein described has particular utility in pattern transfer onto non-planar surfaces.

2. Description of the Related Art

Micro-fabrication involves the fabrication of very small structures, e.g., having features on the order of micrometers or smaller. One industry that has been driving the fabrication of increasingly smaller structures is the electronics industry. As electronic devices have become smaller and faster, the integrated circuits that drive them have necessarily become smaller.

Lithographic techniques are usually employed in the manufacture of integrated circuits. Typically, these lithographic techniques include applying photosensitive materials to a semiconductor substrate. These photosensitive materials, commonly referred to as "resist," are selectively exposed to a form of radiation. An exposure tool and a photomask are often used to obtain the desired selective exposure. Such exposure changes the solubility of the resist such that the photomask's pattern is formed in the resist following a development process to remove the soluble resist.

Historically, exposure tools have been optical systems. However, optical systems are limited in their ability to resolve very small features. For example, the equation for resolution, where $\lambda$ is wavelength and NA is numerical aperture, is as follows:

$$RES = k_1 \lambda / NA$$

The resolution of ever-smaller features requires a reduction of wavelength, an increase in numerical aperture, or both. Of course, reducing wavelength significantly below 248 nm, currently used in deep UV lithography, is not trivial. Further, increasing numerical aperture results in a significant depth of focus loss, as shown in the following equation, where again $\lambda$ is wavelength and NA is numerical aperture:

$$DOF = k_2 \lambda / (NA)^2$$

Accordingly, optical lithography systems capable of printing microstructures may require a depth of focus so small as to be intolerant of slight wafer non-planarity, which commonly results from normal process variation. Therefore, due to slight wafer non-planarity, as well as the limitations of wavelength reduction, optical lithography is limited in its ability to print the sub-100 nm features that will be required for the manufacture of future integrated circuits.

Imprint lithography is capable of manufacturably producing sub-100 nm features. Several imprint lithography techniques have been investigated as low cost, high volume manufacturing alternatives to conventional photolithography for high-resolution patterning. In this emergent technology, a relief image in a template is used to replicate a surface relief into a polymerizable material arranged upon the surface of a substrate. The template makes mechanical contact with the material arranged upon the substrate, and the material is subjected to conditions to solidify and/or polymerize the same such that a relief structure complimentary to that of the template is formed on the substrate. The material may be solidified or polymerized by, for example, heat or light. Such patterning and polymerization techniques may be referred to as thermal imprint lithography or ultraviolet ('UV') imprint lithography, respectively. Typical substrates may include semiconductors, dielectric materials, magnetic, or optoelectronic materials. Unlike optical lithography, resolution of imprint lithography is not limited by wavelength. However, imprint lithography may be limited by the ability to create high-resolution templates and the ability to transfer relief images on such templates. Consequently, templates with an ability to conform to non-planar surfaces are desired. Further, because lithography is typically the single largest component of integrated circuit fabrication cost, a template that may be used interchangeably for either UV or thermal imprinting is desired. It is desired, therefore, to provide an improved template for use in micro-fabrication.

SUMMARY OF THE INVENTION

In an embodiment of the present invention, the imprint lithography template comprises a relief image arranged entirely within an imprinting area and an elastomer adapted to adjust at least a portion of the relief image. In an embodiment, the relief image has features less than about 100 nm. Such a template may include an imprinting area that is transmissive in its entirety to actinic radiation. In an embodiment, the template includes an imprinting layer that is actinic radiation transmissive and a substrate, where the elastomer is arranged between the imprinting layer and the substrate. In an embodiment, elastomer layer and substrate are transmissive to actinic radiation. In an embodiment, the imprinting area is adapted to be conformal with a non-planar surface. In an embodiment, the elastomer layer is the least rigid layer of the template. In this fashion, upon application of a force to the elastomer, the features within the relief image may be advantageously altered.

In an embodiment of the present invention, the template comprises an imprinting layer, where the imprinting layer includes first and second parallel surfaces and the first surface includes an imprinting area having a relief image; an elastomer; and a substrate, where the elastomer is arranged between the substrate and the second surface of the imprinting layer. In an embodiment, the elastomer is less rigid than the substrate. In an embodiment, the elastomer is less rigid than the imprint layer. In this fashion, upon pattern transfer requiring mechanical contact between the template and a non-uniform surface, the imprinting area readily conforms to the non-uniform surface and the relief image is thus adjusted to the surface. In an embodiment, the imprinting area transmits actinic radiation. Such a template may be used not only with UV imprint lithography systems, but also interchangeably with thermal imprint lithography systems.

In an exemplary embodiment, the template is formed by forming a masking layer on a substrate; forming a pattern in the masking layer such that a portion of the substrate is exposed; etching one or more of the exposed portions of the substrate such that a relief image is formed in the substrate; removing the masking layer; coating the relief image with a release agent; depositing a conformal layer upon the substrate such that a portion of the conformal layer is arranged within the relief image formed in the substrate; arranging an elastomer layer on the conformal layer.; arranging a substrate such that the elastomer layer is bonded between the conformal layer and the rigid substrate; and removing from the substrate the lithography template, where the lithography template includes the elastomer layer bonded between the rigid substrate and the conformal layer. In an exemplary embodiment, the template is formed by sequentially forming at least one elastomer layer on a substrate; forming an imprinting layer on the elastomer layer; forming a sacrificial layer on the imprinting layer; forming a masking layer on the sacrificial layer such that a portion of the sacrificial layer is exposed through the masking layer; etching one or more of the exposed portions of the sacrificial layer such that a portion of the imprinting layer is exposed through the masking layer; etching one or more of the exposed portions of the imprinting layer such that a relief image is formed; and removing the entire masking and sacrificial layers. These and other embodiments are herein described.

BRIEF DESCRIPTION OF THE DRAWINGS

The same reference numerals refer to the same parts throughout the various figures.

DETAILED DESCRIPTION OF PREFERRED EMBODIMENTS

Figure 1:
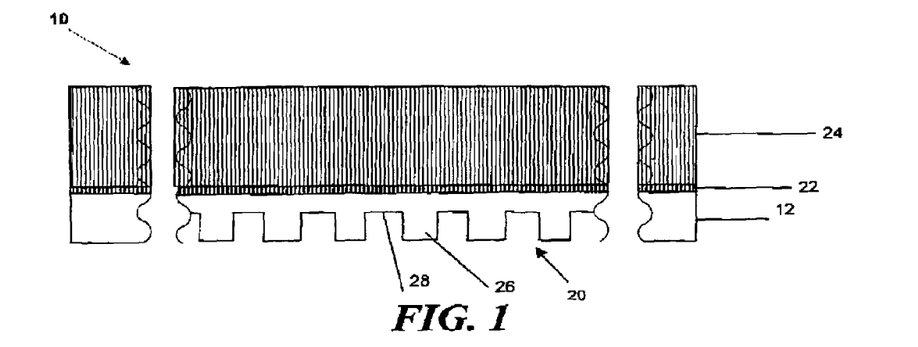
FIG. 1 is a cross-sectional view of an embodiment of the template of the present invention.

Referring to FIG. 1, a template 10 in accordance with an embodiment of the present invention includes an imprinting layer 12, having a relief image 20 therein, an elastomer layer 22 and a substrate 24. Elastomer layer 22 is disposed between imprinting layer 12 and substrate 24. Template 10 is designed for use an imprint lithography system wherein template 10 is urged into a formable material to imprint the same with a pattern that corresponds to relief image 20 for patterned material. The patterned material is subsequently solidified upon exposure to actinic radiation, e.g. ultraviolet radiation, thermal radiation and the like. An exemplary lithographic system is available under the trade name IMPRIO 100™ from Molecular Imprints, Inc., having a place of business at 1807-C Braker Lane, Suite 100, Austin, Tex. 78758. The system description for the IMPRIO 100™ is available at www.molecularimprints.com and is incorporated herein by reference. As a result, substrate 24, elastomer layer 22 and imprinting layer 12 may be transparent to actinic radiation.

Relief image 20 includes a plurality of spaced-apart recesses 28 and protrusions 26. In the present embodiment, recesses 28 are a plurality of grooves extending along a direction parallel to protrusions 26 that provide a cross-section of template 10 with a shape of a battlement. However, recesses 28 and protrusions 26 may correspond to virtually any feature required to create, for example, an integrated circuit. In an embodiment, the recesses and protrusions have a minimum feature size of 100 nm or less. As used herein, a "feature size" generally refers to a width, a length, and/or a depth of one of recesses 28, protrusions 26, or other geometries that comprise relief image 20.

During imprint lithography processes, template 10 is subjected to imprinting forces of several hundred pounds per square centimeter. As a result, it is desired that relief image be formed from a material that will undergo minimal undesired dimensional variations when subjected to imprinting forces. Exemplary materials from which imprinting layer 12 may be formed are glass, quartz, fused silica and the like.

Similarly it is desired that substrate 24 maintain substantial rigidity when subjected to imprinting forces. To that end, substrate 24 may be formed in whole, or in part, of silicon, silicon dioxide, silicon germanium carbon, gallium nitride, silicon germanium, sapphire, gallium arsenide, epitaxial silicon, poly-silicon, boron nitride, quartz, indium tin oxide or combinations thereof. In some embodiments, at least a portion of substrate 24 may be formed of $SiO_x$, where x is less than 2. For example, x may be about 1.5. The thicknesses of substrate 24 is selected so that the same undergoes little or no dimensional variations, e.g., compression, when subjected to imprinting forces.

It is desired that during imprinting processes, that relief image 20 be compliant with the topography of the surface being patterned. To that end, imprinting layer 12 is constructed in such a way as to be rendered compliant. For example, imprinting layer 12 may be provided with the requisite thickness so that the same is compliant in the Z-axis while having minimal dimensional variability in the axes orthogonal thereto, i.e., the X and Y-axes.

To facilitate the compliance of imprinting layer 12, elastomer layer 22 is formed from an appropriate material having an appropriate thickness to undergo deformation in the Z-axis when subjected to imprinting forces. Furthermore, it is desired that elastomer layer 22 have sufficiently suitable memory to return to an initial state in which it is subject to no imprinting forces, thereby obtaining its original shape when a deforming force is removed. Furthermore, the characteristics of elastomer layer 22 are preferably stable over the operational life of template 10. For example, elastomer layer 22 may be chosen to be resistant to degradation or deformation from repeated exposure to radiation and/or repeated mechanical stress.

The desired characteristics of imprinting layer 12 and elastomer layer 22 may be determined emperically. In an embodiment, the characteristics may be first estimated by modeling. For example, a 150 mm wafer may have a 4–5 micron bow from the center of the wafer to the edge of the wafer. Additionally, the wafer may have local surface height variation ranging from, for example, 50–100 nanometers peak-to-peak over a period of, for example, 2–4 mm. A template, which may have a imprinting area in the range of about 5 mm square to about 100 mm square and features less than about 100 nm, is preferably constructed such that its transferred relief image is not distorted by the non-uniformity of the wafer surface with mechanical contact to same. To prevent such distortion, the imprinting area is preferably conformal with the wafer's surface. To obtain the criterion for such a template, parameters such as those above may be input into a computer model. Template criterion may preferably be modeled for each individual processing layer and device, as typical non-uniformity may be process step dependent and/or device dependent. Through modeling and experimentation, the template components may be tuned to provide imprinting area deformation at the correct spatial frequency for removing surface non-planarity and enabling robust pattern transfer.

Figure 2:
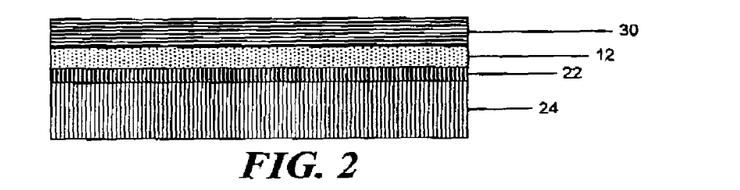
FIG. 2 is a cross-sectional view of a beginning step of an exemplary fabrication method of the template of the present invention.

The fabrication of an exemplary template 10 in accordance with an embodiment of the present invention is now discussed. In FIG. 2, exemplary processing layers are shown in cross-section. It is noted that relative layer thicknesses and structure sizes are not necessarily to scale. As noted above, template 10 comprises a planar substrate 24, which may be, for example, quartz. In an embodiment, substrate 24 may be actinic-radiation-transmissive. On a planar surface of substrate 24, elastomer layer 22 is applied. In an embodiment, substrate 24 is rigid compared to elastomer layer 22. As noted in further detail below, elastomer later 22 may be comprised of one or more viscoelastic materials, and adhesion promoters or other means to enhance adhesion between elastomer layer 22 and the layers adjacent thereto may be employed. In an embodiment, employment of additional adhesion promoters does not render the resultant template opaque.

Upon elastomer layer 22, imprinting layer 12 is arranged. Imprinting layer 12 may be applied using lamination, chemical vapor deposition (CVD), extrusion, spin processing, any combination thereof, or other means commonly known in the art. As an example, imprinting, actinic-radiation-transmissive layer 12 may comprise spin-on-glass or SOG which, as the name implies, is spun on from a liquid state.

Figure 3:
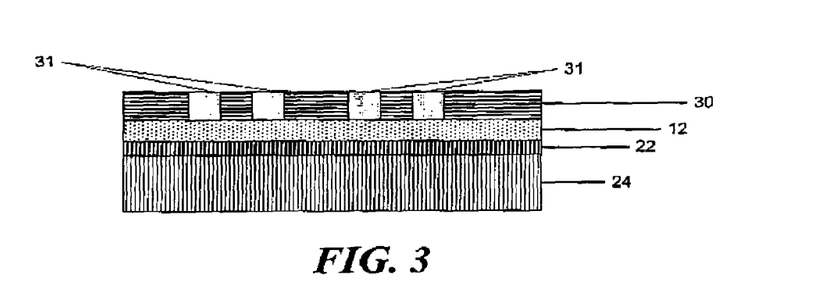
FIG. 3 is a cross-sectional view of a subsequent step of an exemplary fabrication method of the template of the present invention.
Figure 4:
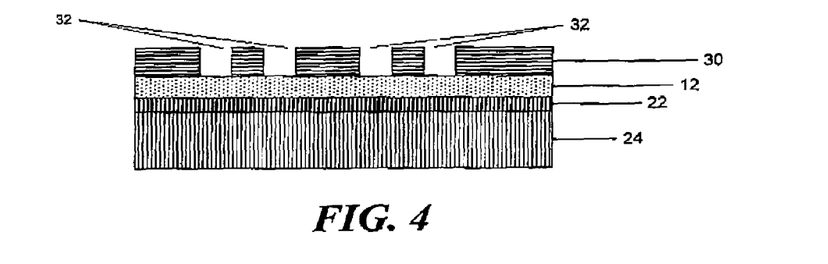
FIG. 4 is a cross-sectional view of a subsequent step of an exemplary fabrication method of the template of the present invention.
Figure 5:
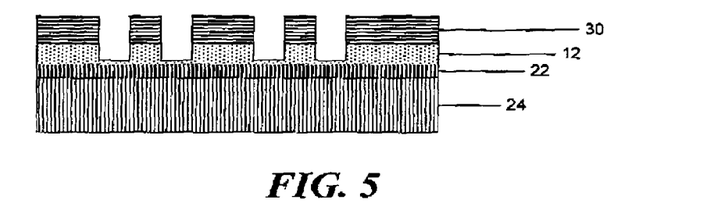
FIG. 5 is a cross-sectional view of a subsequent step of an exemplary fabrication method of the template of the present invention.

On imprinting layer 12, pattern-transferring layer 30 may be arranged. Such a pattern-transferring layer 30 may be a photosensitive layer such as photoresist, also known simply as 'resist.' When exposed, actinic radiation may render the photoresist soluble or insoluble depending on which type of resist is used. A pattern generation process exposes portions 31 of the resist, as illustrated in FIG. 3. In this example, the exposed portions 31 have been rendered soluble. Pattern generation processes may include, but are not limited to, optical systems, e-beam systems, laser systems, and ion systems, among others. A development process removes soluble photoresist, thus forming openings 32, as shown in FIG. 4. Through openings 32, imprinting layer 12 is exposed. As shown in FIG. 5, imprinting layer 12 can be etched while the remaining photoresist serves as a mask. As an example, imprinting layer 12 comprises quartz that may be etched using a fluorine etch chemistry ion in an Inductively Coupled Plasma (ICP). However, implant template fabrication may employ any etch process, dependent upon the etch rate desired and the underlying constituents that form the layer or layers to be etched. Exemplary etch processes may include plasma etching, reactive ion etching, chemical wet etching, and the like. Following the imprinting layer etch, pattern-transferring layer 30 may be stripped leaving the structure shown in FIG. 6. Thus, relief image 20, more clearly illustrated in FIG. 13, is formed in imprinting layer 12.

Figure 7:
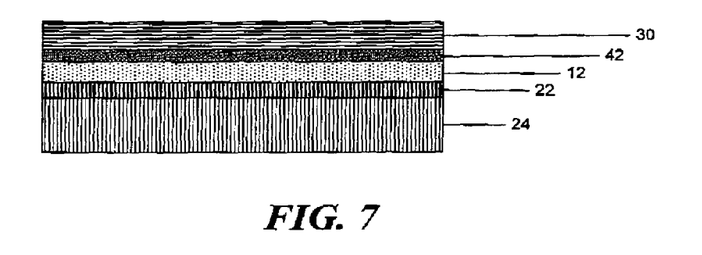
FIG. 7 is a cross-sectional view of a beginning step of an exemplary fabrication method of the template of the present invention.
Figure 8:
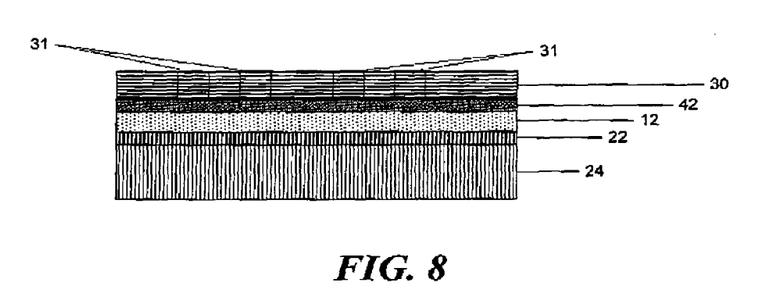
FIG. 8 is a cross-sectional view of a subsequent step of an exemplary fabrication method of the template of the present invention.
Figure 9:
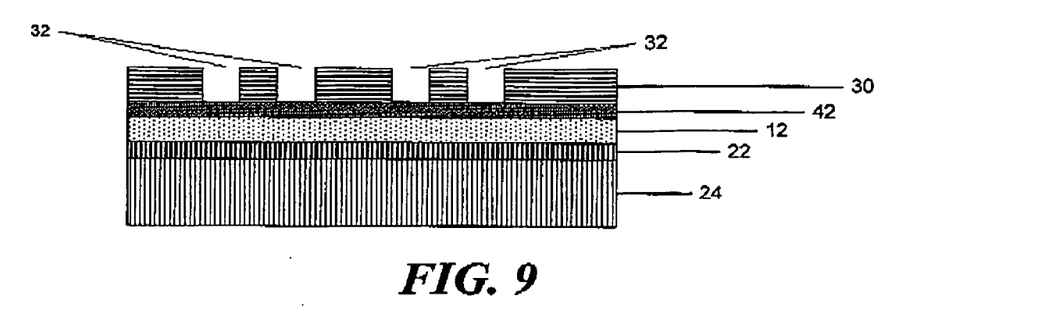
FIG. 9 is a cross-sectional view of a subsequent step of an exemplary fabrication method of the template of the present invention.
Figure 10:
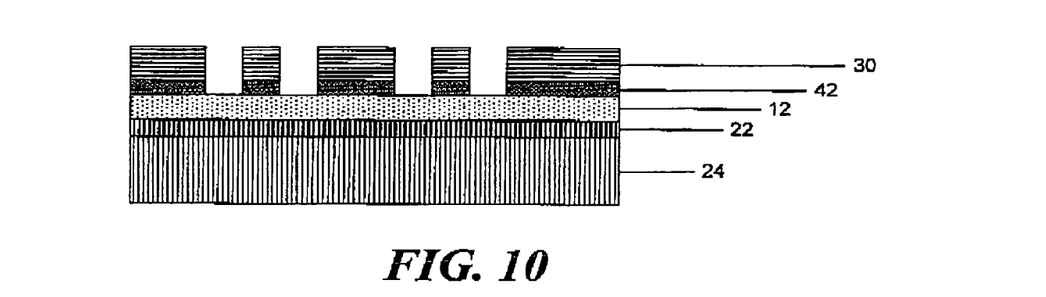
FIG. 10 is a cross-sectional view of a subsequent step of an exemplary fabrication method of the template of the present invention.

In an embodiment, an optional sacrificial layer 42 may be arranged between pattern-transferring layer 30 and imprinting layer 12, as shown in FIG. 7. Pattern-transferring layer 30 could be arranged on optional sacrificial layer 42 and patterned as described above. That is, as shown in FIG. 8, a pattern generation process exposes portions 31 of the resist, rendering portions 31 soluble. A development process forms openings 32, as shown in FIG. 9. Through openings 32, sacrificial layer 42 is exposed. As shown in FIG. 10, sacrificial layer 42 can be etched, while the remaining pattern-transferring layer 30 serves as a mask.

Figure 11:
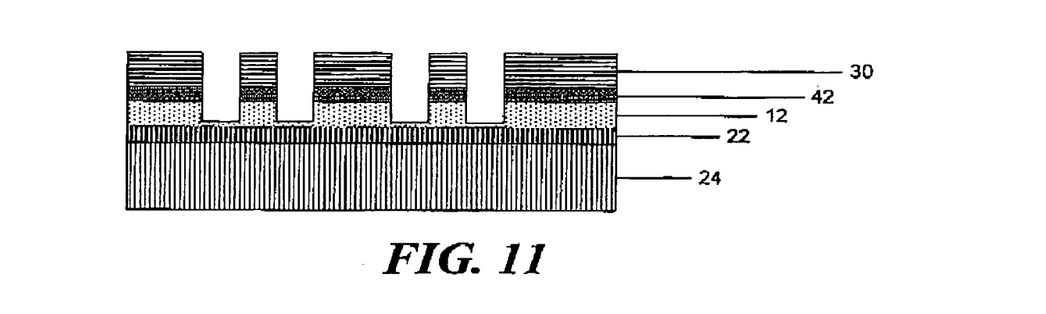
FIG. 11 is a cross-sectional view of a subsequent step of an exemplary fabrication method of the template of the present invention.
Figure 12:
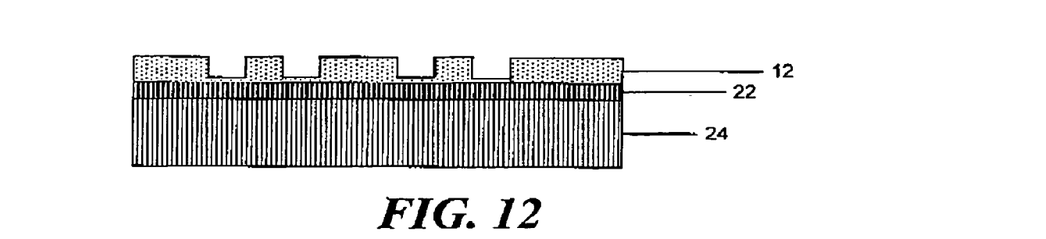
FIG. 12 is a cross-sectional view of a subsequent step of an exemplary fabrication method of the template of the present invention.

Sacrificial layer 42 may be chosen to have properties that may facilitate the template patterning process. As an example, sacrificial layer 42 may be conductive, thus facilitating e-beam patterning by providing a means to bleed charge. As another example, sacrificial layer 42 may have a chemistry chosen to enhance the subsequent etching of imprinting layer 12. Sacrificial layer 42 may have a composition which will improve the subsequent imprinting layer etch. Imprinting layer 12 is etched in FIG. 11. In an embodiment, when etched, sacrificial layer 42 may provide a desirable in situ surface treatment to relief image 20. Sacrificial layer 42 may be opaque, as in an embodiment it will ultimately be removed. For example, sacrificial layer 42 is removed in FIG. 12. Hence, in an exemplary embodiment, sacrificial layer 42 is preferably of a material that may be removed without damaging or otherwise permanently compromising the future functionality of relief image 20 within imprinting layer 12. Sacrificial layer 42 is preferably removed in its entirety from at least imprinting area 18 of imprinting, actinic-radiation transmissive layer 12. That is sacrificial layer 42 is preferably removed from at least the area of the template which necessarily contacts a material on a surface to replicate relief image 20 onto the surface.

Figure 13:
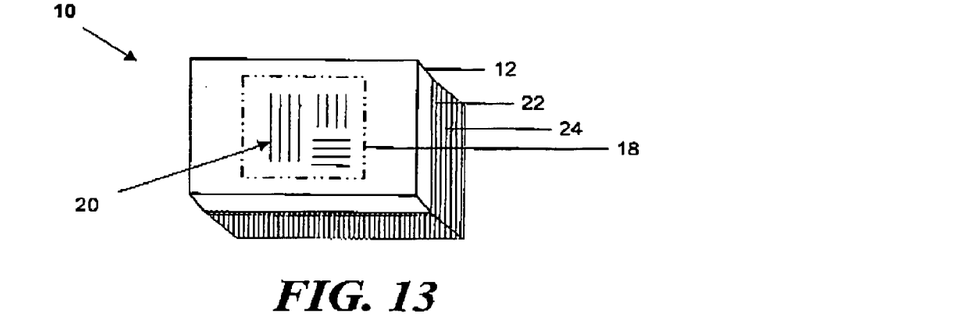
FIG. 13 is a plan view of an embodiment of the template of the present invention.
Figure 14:
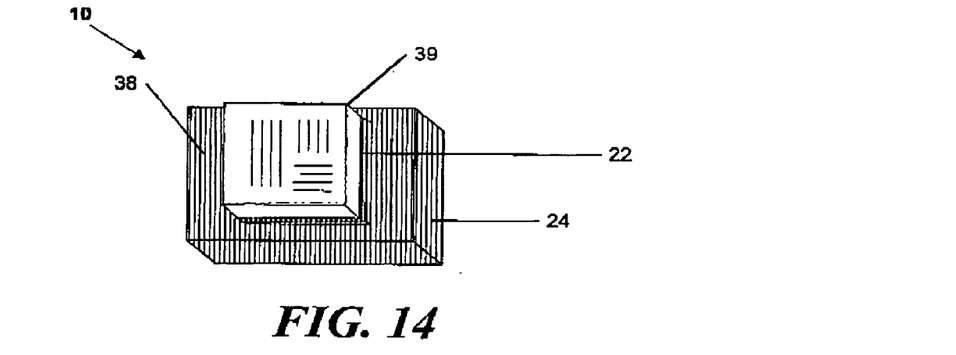
FIG. 14 is a plan view of an embodiment of the template of the present invention.
Figure 15:
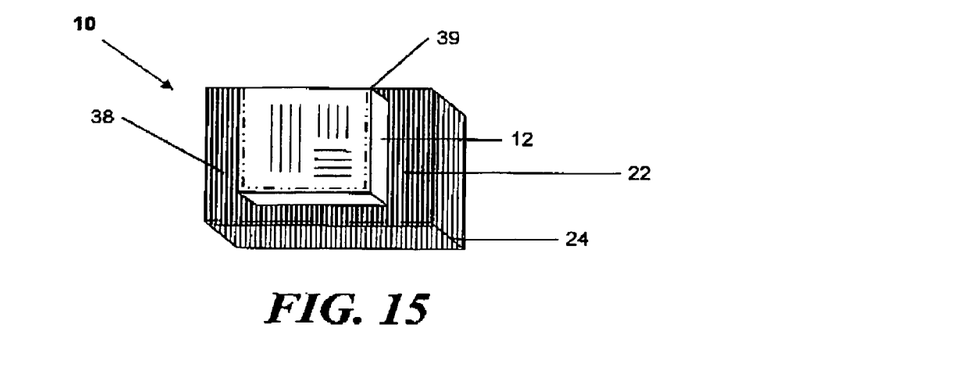
FIG. 15 is a plan view of an embodiment of the template of the present invention.
Figure 16:
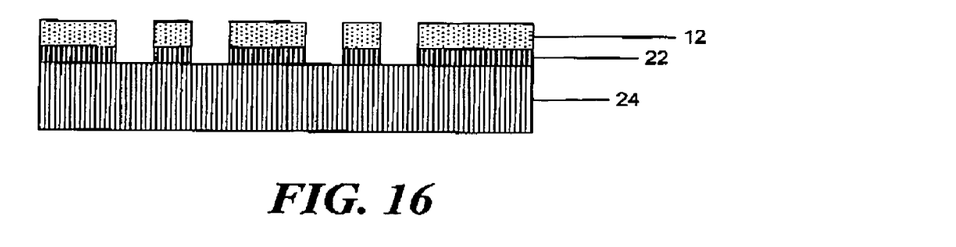
FIG. 16 is a cross-sectional view of an exemplary fabrication method of the template of the present invention.

A plan view of an exemplary template is shown in FIG. 13. Relief image 20 is etched into imprinting layer 12, which is spaced from substrate 24 by elastomer layer 22. Relief image 20 is arranged entirely within imprinting area 18. At this point in the processing, it may be desirable to etch template 10 such that imprinting area 18 is a level spaced distance above the peripheral substrate 38, as shown in FIG. 14. In particular, imprinting area 18 is atop 'mesa' 39. Relief image 20 is arranged entirely within imprinting area 18. Mesa 39 may be created as follows. After relief image 20 has been etched into template 10 and any masking layers removed, the template is again coated with pattern-transferring layer 30. This photosensitive layer covers an entirety of template 10, including relief image 20. The perimeter of peripheral substrate 38, that area extending from a periphery of imprinting area 18 towards the periphery of template 10, is exposed and etched. In this manner, a raised area, or 'mesa' 39, within peripheral substrate 38 is formed. Following the perimeter etch, the photoresist is removed from mesa 39. The resultant template 10 comprises relief image 20 arranged upon a raised mesa 39. In an embodiment, mesa 39 has a height of less than about 15 μm. However, the height of mesa 39 may vary.

Figure 6:
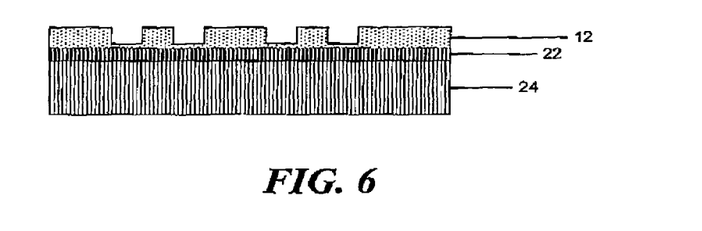
FIG. 6 is a cross-sectional view of a subsequent step of an exemplary fabrication method of the template of the present invention.

Depending upon the thickness of the material used for imprinting layer 12, mesa 39 may include elastomer layer 22, as shown in FIG. 5. That is, the perimeter etch employed to create mesa 39 may also etch through elastomer layer 22 and into rigid substrate 24. In an embodiment, such exposed elastomer sidewalls commensurate with mesa 39 sidewalls may be desirable. In an alternate embodiment, it may be desirable to choose an imprinting layer thickness and mesa 39 height that will leave elastomer layer 22 intact. That is, it may be undesirable to create exposed elastomer sidewalls commensurate with mesa 39 sidewalls. In such an embodiment, such periphery is etched such that only imprinting layer 12 is removed, leaving at least a portion of the elastomer peripheral to mesa 39, as shown in FIG. 6.

Described above are embodiments of the fabrication of a compliant template 10 comprising a rigid substrate 24, elastomer layer 22, and imprinting layer 12 where these template components are integral at the time of relief image patterning. However, in an embodiment, the thickness of imprinting layer 12 may be changed following relief image patterning. The thickness of imprinting layer 12 may be reduced by, for example, etching, cleaving, polishing, or otherwise removing a portion of the above-described first substantially planar side of imprinting layer 12. Following the creation of relief image 20, the thickness of imprinting layer 12 is adjusted to a compliant thickness that, in a preferred embodiment, is determined experimentally. Once imprinting layer 12 is adjusted to a compliant thickness, imprinting layer 12 is arranged upon substrate 24 such that an elastomer is arranged between the imprinting layer and rigid substrate 24. In an embodiment, elastomer layer 22 is less rigid than substrate 24. In an embodiment, substrate 24, elastomer layer 22, and imprinting layer 12 transmit actinic radiation. In various embodiments, elastomer layer 22 may be arranged upon substrate 24 in any one of a number of methods as discussed above.

In an alternate embodiment, an inverse relief image is etched into a master from which any number of templates may be subsequently constructed. Consequently, such a master may be constructed from an opaque material, or such a master may be comprised of any of the above materials that may be suitable for a substrate. The master material may be chosen for its ability to be patterned, and its subsequent ability to provide a mold from which templates may be constructed. In an embodiment, a master is constructed from a quartz substrate.

Necessarily, a master from which templates are constructed contains an inverse of the desired template pattern. To create a template having the desired pattern from such a master, a conformal imprinting layer is arranged commensurate with that surface of the master which contains the inverse relief image. Such a surface may be coated with a release agent prior to the arrangement of the imprinting layer. An exemplary release agent is disclosed in U.S. patent application Ser. No. 10/375,382, filed Feb. 27, 2003, entitled "Composition and Method to Form a Release Layer," which is assigned to the assignee of the present invention and is incorporated by reference in its entirety herein. In an exemplary embodiment, imprinting layer 12 is not only conformal, but also actinic-radiation-transmissive. The actinic-radiation-transmissive conformal layer may be spun on or deposited via, for example, chemical vapor deposition, or created by any other means commonly known in the art. A transmissive elastomer is arranged on the imprinting layer. A rigid, actinic-light-transmissive substrate is arranged on the elastomer. Adhesion promoters or other means to prevent future delamination of the layers of the template may be employed. Subsequently, a light-transmissive template comprising a rigid substrate, an elastomer, and a conformal layer may be removed from the master.

Described above are embodiments of the fabrication of a compliant template that contemplate creating relief image 20 by removing a portion of imprinting layer 12. However, in an embodiment, imprinting layer 12 may be created by deposition. That is, imprinting layer 12 may be created by, for example, focused ion beam deposition of imprinting layer 12 such that relief image 20 is formed in situ. Imprinting layer 12 may be deposited on embodiments of above-described elastomer layer 22 and rigid substrate 24.

Described above are embodiments of the fabrication of a compliant template that contemplate elastomer layer 22 extending continuously throughout imprinting area 18. However, in an embodiment, a template having elastomer layer 22 that does not extend continuously through imprinting area 18 may be desired. That is, elastomer layer 22 having elastomer features which have a one-to-one correlation with the actinic-radiation-transmitting features which comprise imprinting layer 12 may be desirable. Such a template could be designed to be very compliant. Such a template could be constructed, for example, by patterning a thin-light transmissive layer, where the thin light-transmissive layer is arranged on elastomer layer 22, and where elastomer layer 22 is arranged on rigid substrate 24. When the thin light-transmissive layer is etched, elastomer layer 22 may also be etched such that the individual relief features are comprised of a light transmissive portion and an elastomer portion, as shown in FIG. 7.

Elastomer layer 22 chosen for the embodiments herein may be comprised of one or more materials having viscoelastic properties. In particular, elastomer layer 22 may comprise one or more layers of viscoelastic material. Each material used to form elastomer layer 22 may be applied independently. In an embodiment, the elastomer is substantially transparent to actinic light, e.g., ultraviolet light. The viscoleastic material(s) may be chosen according to their physical properties. For example, properties which may be of interest are actinic light transmissivity, solvent and/or chemical resistance, adhesion, wetability, resistivity to degradation, conductivity, Poisson's ratio, and others. In an exemplary embodiment, the elastomer is polydimethylsiloxane, or PDMS.

The properties of PDMS may vary according to the amount of cross-linking present, which may be varied by altering the composition of the PDMS. PDMS has a relatively high coefficient of thermal expansion. Consequently, special consideration may be taken for a template made from PDMS and contemplated for UV imprinting, as well as thermal imprinting. For example, a thermal imprint system that applies heat from a semiconductor wafer substrate in order to crosslink polymerizable material arranged on a wafer surface may be considered. An exemplary thermal imprint system is disclosed in U.S. patent application Ser. No. 10/753,384, filed Jan. 15, 2004, entitled "Thermal Processing System for Imprint Lithography," assigned to the assignee of the present invention, and which is incorporated by reference herein in its entirety. The elastomer PDMS may be used in conjunction with at least one additional elastomer. The elastomers may be chosen with physical properties that interact for a desired result. For example, the differing coefficients of thermal expansion, differing Poisson's ratios, or differing adhesive properties may determine which materials comprise elastomer layer 22. The arrangement of such materials may also be thusly determined. In an embodiment, adhesion promoters may also be used in elastomer layer 22.

For example, PDMS may employ an additional adhesion promoter, as PDMS is somewhat hydrophobic. In an embodiment, additional processing may occur between or commensurate with the application of the layers comprising elastomer layer 22. For example, the PDMS surface may be oxidized to improve adhesion.

In an embodiment, fluoridated rubbers may be used for the elastomer instead of or in addition to PDMS. As shown in FIG. 6, it may be desirable to construct a template having a transmissive rigid substrate having elastomer layer 22 thereupon, where the patterning layer is arranged such that rigid substrate 24, as well as elastomer layer 22, extends around the periphery of the patterning layer. That is, leaving an area around imprinting area 18 exposed. In such a case, resilient elastomer may be desirable. Fluoridated rubbers may be chosen for their resilient properties. For example, Kalrez™ is a material made of perfluore rubber, which can withstand oxygen plasma or oxygen/$CF_4$ plasma etches. Fluoridated rubbers may be desirable for their resistance to acid and solvent corrosion, as well as a wide range of chemicals, even at high temperatures. As another example, Viton™ is a material made of fluoridated rubber that may withstand temperatures from about −15° C. up to about 280° C. An elastomer having such resilience to high temperatures is desirable when contemplating a dual-purpose template. That is, a template that may be used interchangeably for either UV or thermal imprint lithography applications. However, resistance to a wide range of chemicals is also important when considering applications for the instant invention.

The complimentary relief images formed on wafer surfaces as discussed above are typically sacrificial layers. That is, the relief images are applied to facilitate the patterning of one or more device layers arranged below the sacrificial relief image, and the sacrificial relief image is typically removed in its entirety following the patterning of said device layer(s). However, the improved template and the associated imprint techniques herein described are not necessarily limited to creating sacrificial layers. The improved template may be used for applications wherein a functional device layer is created directly from the relief image. Creating a device layer directly from a relief image could eliminate steps in the manufacturing process of an integrated circuit, thus desirably reducing the manufacturing cycle time. Such device layer creation would eliminate processing steps needed to create and to remove a patterned sacrificial layer. Such imprint device layer creation would preferably employ processing fluids that form functional device features upon imprinting and curing. For example, interconnects for an integrated circuit could be formed directly if an imprint template configured to form interconnect structures was used in conjunction with a conductive imprint relief material, thus forming conductors upon curing. Such a process could be used to create interconnects without the need for a sacrificial patterning layer. In addition to conductive layers, other imprint relief materials may be curable to form semiconductive layers, dielectric layers, and/or a layer having a desired mechanical, hermetic, or optical property.

As noted above, an objective of the instant invention is to provide a compliant template to be used with imprint lithography. As described above, an embodiment of the template contemplated herein is constructed having characteristics that enable conformality between a template and a patterning surface, thus ensuring an accurate transfer of the relief image from one imprint to the next. However, it is noted that the present invention also contemplates an embodiment that advantageously transfers an altered relief image. In an embodiment, the compliant template may be constructed such that the Poisson's ratio enables the template to advantageously alter, thus forming features having dimensions smaller than what can be patterned using leading-edge patterning systems, such as, for example, e-beam pattern generators. In such an embodiment, templates may be created using a plurality of elastomers having both positive and negative Poisson's ratios. Such a template may include elastomer layer 22 comprised of a plurality of elastomers arranged such that the imprinting layer above such elastomer layer 22 has imprinting features that are each affected only by the deformation of a single corresponding elastomer. In an embodiment, it may be desirable to create numerous partial templates for a single processing layer. Such a partial template would transfer only a portion of the features of the processing layer. Thus multiple imprinting steps for a single processing layer could be employed. For example, a first template could imprint the horizontal features, and a second template could imprint the vertical features. Such a process would enable the use of a single deformable elastomer per template. In yet another embodiment, a template having imprinting layers with viscoelastic properties is contemplated. Such a template may employ an elastomer layer that can be patterned, thus obviating the need for an additional imprinting layer. Such a template could also be designed to advantageously alter the imprint features, thus producing even smaller geometries than can be patterned onto a template.

While preferred embodiments of the compliant template have been described in detail, it should be apparent that modifications and variations thereto are possible, all of which fall within the true spirit and the scope of the invention. With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention. For example, any suitable elastomer may be used instead of the PDMS described. Also, the imprinting layer may be any suitable material other than SOG. In fact, the imprinting layer may be eliminated altogether in the presence of a patternable elastomer. And although patterning features less than about 100 nm have been described, it should be appreciated that the compliant template herein described is also suitable for patterning any size features as may be required in the fabrication of, for example, an integrated circuit. Furthermore, a wide variety of materials may be used in the fabrication of the template herein described instead of the materials noted. Materials and methods may be chosen in accordance with their abilities to fabricate a template which may be optically transparent and conformal to a surface; and/or which may be used for two or more types of imprint lithography; and/or which may used to create features directly without the use of a sacrificial layer; and/or which may advantageously alter a relief image therein upon use, thus enabling ever-smaller feature sizes.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A lithography template comprising:
   a body;
   an imprinting layer comprising a plurality of protrusions and recessions, defining a pattern; and
   an elastomer positioned between said imprinting layer and said body, with said elastomer being configured to alter a portion of said pattern.

2. The template as recited in claim 1, wherein said imprinting layer is substantially transparent to actinic radiation.

3. The template as recited in claim 1, wherein said imprinting layer is substantially transparent to visible light.

4. The template as recited in claim 1, wherein said imprinting layer comprises a first surface substantially parallel to a second surface, with said first surface comprising said pattern and said elastomer being adjacent to said second surface.

5. The template as recited in claim 1, wherein said body is more rigid than said imprinting layer.

6. The template as recited in claim 1, wherein said body is substantially transparent to actinic radiation.

7. The template as recited in claim 1, wherein said imprinting layer is conformal with a wafer surface.

8. The template as recited in claim 1, wherein said template is substantially transparent to actinic radiation.

9. The template as recited in claim 1, wherein said pattern comprises features having dimensions less than about 100 nm.

10. The template as recited in claim 1, wherein said pattern comprises features having dimensions, and wherein altering at least a portion of said pattern comprises altering at least one dimension of at least one feature.

11. A lithography template comprising:
    a body;
    an imprinting layer comprising a plurality of protrusions and recessions, defining a pattern; and
    an elastomer, positioned between said imprinting layer and said body, with said elastomer being configured to alter a portion of said pattern in a first direction while minimizing dimensional variability in a second direction orthogonal to said first direction.

12. The template as recited in claim 11, wherein said elastomer is less rigid than said body.

13. The template as recited in claim 11, wherein said elastomer is less rigid than said imprinting layer.

14. The template as recited in claim 11, wherein said imprinting layer is substantially transparent to actinic radiation.

15. The template as recited in claim 11, wherein said elastomer is substantially transparent to actinic radiation.

16. The template as recited in claim 11, wherein said body is substantially transparent to actinic radiation.

17. The template as recited in claim 11, wherein said imprinting layer is conformal with a non-planar surface.

18. The template as recited in claim 11, wherein said imprinting layer comprises a first surface substantially parallel to a second surface, with said first surface comprising said pattern and said elastomer being adjacent to said second surface.

19. The template as recited in claim 1, wherein said elastomer is further configured to be resistant to degradation and deformation.

20. The template as recited in claim 1, wherein said elastomer is contiguous with said imprinting layer.

21. The template as recited in claim 11, wherein said elastomer is further configured to be resistant to degradation and deformation.

22. The template as recited in claim 11, wherein said elastomer is contiguous with said imprinting layer.

23. A lithography template comprising:
    a body;
    an imprinting layer comprising a plurality of protrusions and recessions, defining a pattern; and
    an elastomer positioned between said imprinting layer and said body, with said elastomer being configured to alter a portion of said pattern in response to a force while having suitable memory to return to an initial state in an absence of said force.

24. The template as recited in claim 23, wherein said imprinting layer is substantially transparent to actinic radiation.

25. The template as recited in claim 23, wherein said imprinting layer is substantially transparent to visible light.

26. The template as recited in claim 23, wherein said imprinting layer comprises a first surface substantially parallel to a second surface, with said first surface comprising said pattern and said elastomer being adjacent to said second surface.

27. The template as recited in claim 23, wherein said body is more rigid than said imprinting layer.

28. The template as recited in claim 23, wherein said body is substantially transparent to actinic radiation.

29. The template as recited in claim 23, wherein said imprinting layer is conformal with a non-planar surface.

30. The template as recited in claim 23, wherein said template is substantially transparent to actinic radiation.

31. The template as recited in claim 23, wherein said pattern comprises features having dimensions, and wherein altering at least a portion of said pattern comprises altering at least one dimension of at least one feature.

32. A lithography template, said template being substantially transparent to actinic radiation, said template comprising:
    a body;
    an imprinting layer comprising a plurality of protrusions and recessions, defining a pattern, with said imprinting layer being conformal with a non-planar surface of a substrate; and
    an elastomer positioned between said imprinting layer and said body, with said elastomer being configured to alter a portion of said pattern.

* * * * *